United States Patent
Naito et al.

(10) Patent No.: US 12,207,484 B2
(45) Date of Patent: Jan. 21, 2025

(54) DISPLAY PANEL AND DISPLAY DEVICE INCLUDING ADHESIVE LAYER FOR INCREASING IMPACT RESISTANCE

(71) Applicant: JOLED INC., Tokyo (JP)

(72) Inventors: Nobuo Naito, Tokyo (JP); Takahiro Seki, Tokyo (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 393 days.

(21) Appl. No.: 17/398,441

(22) Filed: Aug. 10, 2021

(65) Prior Publication Data
US 2022/0059789 A1    Feb. 24, 2022

(30) Foreign Application Priority Data

Aug. 20, 2020   (JP) .................. 2020-139339

(51) Int. Cl.
*H10K 50/11* (2023.01)
*H10K 50/842* (2023.01)
*H10K 102/00* (2023.01)

(52) U.S. Cl.
CPC .......... *H10K 50/11* (2023.02); *H10K 50/8426* (2023.02); *H10K 2102/311* (2023.02)

(58) Field of Classification Search
CPC ............. H10K 50/11; H10K 50/8426; H10K 2102/311
USPC .......................................................... 257/40
See application file for complete search history.

(56) References Cited

U.S. PATENT DOCUMENTS

| | | | |
|---|---|---|---|
| 10,083,636 B2 | 9/2018 | Han | |
| 10,175,738 B2 | 1/2019 | Kim | |
| 2010/0079635 A1* | 4/2010 | Yano | G02B 3/0062 |
| | | | 359/503 |
| 2015/0048349 A1 | 2/2015 | Kawata et al. | |
| 2016/0343781 A1 | 11/2016 | Kawata et al. | |
| 2017/0242290 A1 | 8/2017 | Jenkins et al. | |
| 2019/0252485 A1 | 8/2019 | Kishimoto et al. | |
| 2019/0259310 A1 | 8/2019 | Ha et al. | |
| 2019/0333978 A1 | 10/2019 | Lee | |
| 2020/0058711 A1 | 2/2020 | Seomoon et al. | |

(Continued)

FOREIGN PATENT DOCUMENTS

| | | |
|---|---|---|
| CN | 111524934 | 8/2020 |
| JP | 2015-062060 | 4/2015 |

(Continued)

OTHER PUBLICATIONS

Office Action issued by the China National Intellectual Property Administration (CNIPA) in Chinese Patent Application No. 202110895522.2, dated Jan. 26, 2024, together with an English language translation of te Search Report.

*Primary Examiner* — Xia L Cross
(74) *Attorney, Agent, or Firm* — GREENBLUM & BERNSTEIN, P.L.C.

(57) ABSTRACT

The display panel is a display panel that is flexible, including: an EL structure layer including a plurality of EL elements arranged two-dimensionally; a foamed resin layer on a side of the EL structure layer that is opposite to a light emitting surface of the EL structure layer; a metal layer provided between the EL structure layer and the foamed resin layer; and a first adhesive layer provided between the EL structure layer and the metal layer and comprises an adhesive having an elastic modulus of 90 kPa or more.

11 Claims, 11 Drawing Sheets

(56) References Cited

U.S. PATENT DOCUMENTS

| | | | |
|---|---|---|---|
| 2020/0251679 A1 | 8/2020 | Ha et al. | |
| 2020/0266250 A1* | 8/2020 | Kawata et al. | |
| 2021/0013447 A1* | 1/2021 | Lee | B32B 3/02 |
| 2022/0011814 A1* | 1/2022 | Ryou | B32B 7/14 |
| 2023/0147069 A1 | 5/2023 | Kawata et al. | |

FOREIGN PATENT DOCUMENTS

| | | |
|---|---|---|
| JP | 2020-021091 | 2/2020 |
| KR | 10-2018-0045929 | 5/2018 |

* cited by examiner

FIG. 5A

| Drop height (cm) in darts test | | | Thickness of metal layer (μm) | | | | | | | | |
|---|---|---|---|---|---|---|---|---|---|---|---|
| | | | 0 (None) | 5 | 10 | 20 | 29 | 40 | 50 | 100 | 200 |
| Thickness of foamed resin layer (μm) | Urethane foam | 0 (None) | 7 | — | — | — | 59 | 63 | 69 | 69 | 95 |
| | | 100 | — | — | — | — | 69 | 69 | 74 | 79 | 95 |
| | | 200 | — | — | — | — | 38 | 40 | 85 | 85 | 95 |
| | | 300 | — | — | — | — | 42 | 43 | 48 | 95 | 95 |
| | | 400 | — | — | — | — | 30 | 29 | 26 | 95 | 95 |
| | | 500 | — | — | — | — | 29 | 27 | 34 | 95 | 95 |
| | | 1000 | 2 | — | — | — | 70 | 72 | 95 | 95 | 95 |
| | | 1500 | — | — | — | — | 71 | 74 | 95 | 95 | 95 |
| | Silicone foam | 800 | 4 | 17 | 29 | 76 | 95 | 95 | 95 | 95 | 95 |

FIG. 5B

| Drop height (cm) in pen drop test | | | Thickness of metal layer (μm) | | | | | | | | |
|---|---|---|---|---|---|---|---|---|---|---|---|
| | | | 0 (None) | 5 | 10 | 20 | 29 | 40 | 50 | 100 | 200 |
| Thickness of foamed resin layer (μm) | Urethane foam | 0 (None) | 3 | — | — | — | 6 | 5 | 7 | 5 | 5 |
| | | 100 | — | — | — | — | 7 | 7 | 7 | 8 | 9 |
| | | 200 | — | — | — | — | 8 | 9 | 9 | 12 | 11 |
| | | 300 | — | — | — | — | 8 | 9 | 11 | 16 | 15 |
| | | 400 | — | — | — | — | 10 | 9 | 12 | 17 | 14 |
| | | 500 | — | — | — | — | 12 | 12 | 13 | 20 | 20 |
| | | 1000 | 2 | — | — | — | 14 | 14 | 23 | 32 | 32 |
| | | 1500 | — | — | — | — | 16 | 21 | 19 | 30 | 33 |
| | Silicone foam | 800 | 4 | 7 | 10 | 15 | 13 | 15 | 19 | 24 | 29 |

DISPLAY PANEL AND DISPLAY DEVICE INCLUDING ADHESIVE LAYER FOR INCREASING IMPACT RESISTANCE

CROSS REFERENCE TO RELATED APPLICATION

The present application is based on and claims priority of Japanese Patent Application No. 2020-139339 filed on Aug. 20, 2020. The entire disclosure of the above-identified application, including the specification, drawings and claims is incorporated herein by reference in its entirety.

FIELD

The present disclosure relates to a display panel that is flexible and a display device including this display panel.

BACKGROUND

As a display panel used for display devices such as digital televisions and digital signage, a display panel that is flexible that is bendable is known. The display panel that is flexible is characterized by being thin, light, and flexible, but is also vulnerable to external impact.

As an example of this type of display panel, Patent Literature (PTL) 1 discloses a display panel that is provided with protective sheets on both sides of the panel. Since this display panel is provided with protective sheets, it is possible to absorb an external impact while suppressing the occurrence of cracks.

CITATION LIST

Patent Literature

PTL 1: Japanese Unexamined Patent Application Publication No. 2020-21091

SUMMARY

Technical Problem

For example, when the display panel is used for a display device such as a smartphone, a tablet terminal, or a wearable terminal, it may be impacted by the contact of a writing instrument or a finger. Therefore, the display panel is required to have impact resistance that can withstand the impact caused by the contact of a writing instrument or a finger.

The present disclosure has been made to solve the above problems, and an object of the present disclosure is to provide a display panel, and the like, having impact resistance.

Solution to Problem

One aspect of the display panel according to the present disclosure is a display panel that is flexible, including: an electroluminescence (EL) structure layer including a plurality of EL elements arranged two-dimensionally; a foamed resin layer on a side of the EL structure layer that is opposite to a light emitting surface of the EL structure layer; a metal layer provided between the EL structure layer and the foamed resin layer; and a first adhesive layer provided between the EL structure layer and the metal layer and comprises an adhesive having an elastic modulus of 90 kPa or more.

One aspect of the display device according to the present disclosure includes the display panel described above and a driver that drives the display panel.

Advantageous Effects

According to the present disclosure, it is possible to provide a display panel, and the like, having impact resistance.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5A is a diagram showing test results regarding a metal layer and a foamed resin layer of the display panel.

FIG. 5B is a diagram showing test results regarding a metal layer and a foamed resin layer of the display panel.

DESCRIPTION OF EMBODIMENTS

Figure 1:
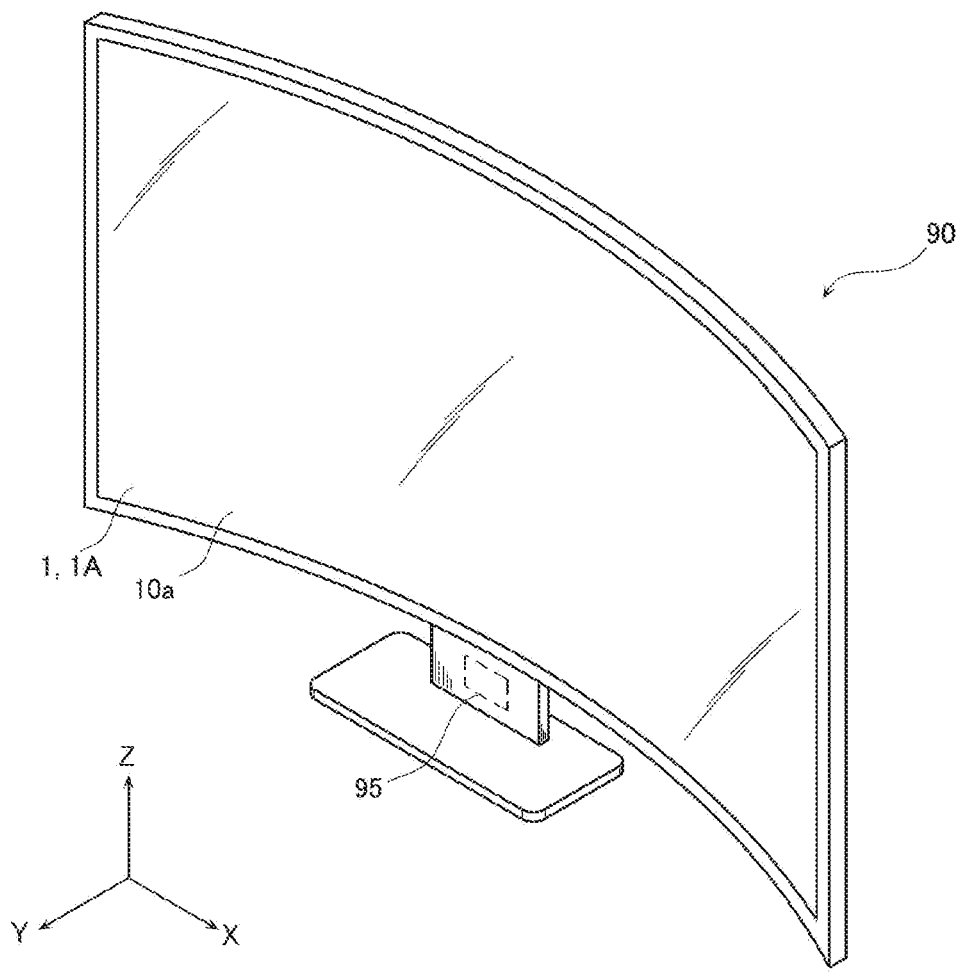
FIG. 1 is a schematic view showing a display device including a display panel according to an embodiment.

Hereinafter, embodiments of the display panel according to the present disclosure will be described with reference to the drawings. It should be noted that all of the embodiments described below show a specific example of the present disclosure. Therefore, numerical values, components, arrangement positions and connection forms of the components, and the like shown in the following embodiments are examples and are not intended to limit the present disclosure. Therefore, among the components in the following embodiments, the components not described in the independent claim are described as arbitrary components.

In each figure, substantially the same components are given the same reference numerals. In addition, each figure is a schematic view, and the film thickness, the ratio of the size of each part, and the like are not necessarily strictly represented.

EMBODIMENT

1. Configuration of Display Device

The display device including the display panel according to the present embodiment will be described with reference to FIG. 1 and FIG. 2.

Figure 2:
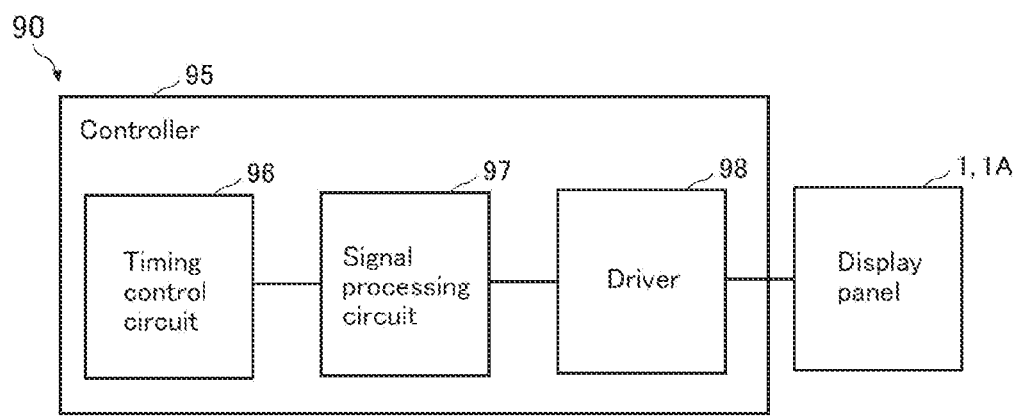
FIG. 2 is a block diagram showing a configuration of the display device according to the embodiment.

FIG. 1 is a schematic view showing display device 90 including display panel 1 according to the embodiment. FIG. 2 is a block diagram showing the configuration of display device 90.

Display device 90 includes display panel 1 that is flexible and controller 95 that drives and controls display panel 1.

Display panel 1 includes a plurality of pixels arranged in a two-dimensional matrix. In the display panel for color display, for example, three sub-pixels are formed by three electroluminescence (EL) elements corresponding to respective colors of RGB (red, green, and blue), and one pixel is formed by combining these three sub-pixels. It should be noted that each pixel is not limited to three sub-pixels, and may be formed by one sub-pixel by W (white) or four sub-pixels by RGBW.

Controller 95 includes timing control circuit 96, signal processing circuit 97, and driver 98. Timing control circuit 96 includes a timing generator that generates a control signal, and controls the timing of signal processing circuit 97 and the like based on the generated control signal. Signal processing circuit 97 performs a predetermined correction on the digital video signal input from the outside, and outputs the corrected video signal to driver 98. Driver 98 includes a scanning line driving circuit, a signal line driving circuit, and the like, and drives a plurality of pixels of display panel 1 via the scanning lines and the signal lines.

FIG. 1 shows an example in which display device 90 is a digital television, but the present disclosure is not limited thereto, and display device 90 may be digital signage, a smartphone, a tablet terminal, or a wearable terminal. Display panel 1 used in these display devices 90 is required to have impact resistance in addition to flexibility.

2. Structure of Display Panel

Next, the structure of display panel 1 will be described with reference to FIG. 3.

Figure 3:
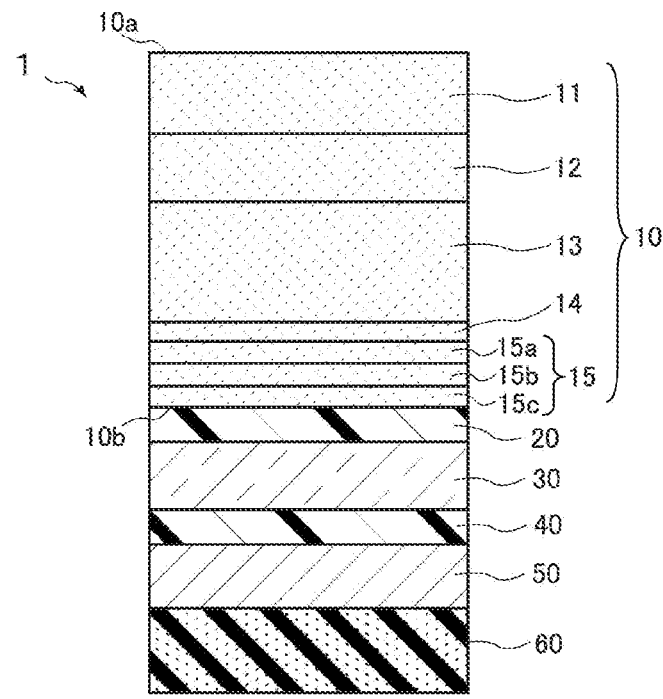
FIG. 3 is a cross-sectional view of the display panel according to the embodiment.

FIG. 3 is a cross-sectional view of display panel 1 according to the embodiment. FIG. 3 is a cross-sectional view of the YZ plane or the XY plane in FIG. 1.

Display panel 1 includes EL structure layer 10, first adhesive layer 20, intermediate layer 30, second adhesive layer 40, metal layer 50, and foamed resin layer 60.

Foamed resin layer 60 is provided on the opposite side of light emitting surface 10a of EL structure layer 10. Metal layer 50 is provided between EL structure layer 10 and foamed resin layer 60. Intermediate layer 30 is provided between EL structure layer 10 and metal layer 50. Each of first adhesive layer 20 and second adhesive layer 40 is provided between EL structure layer 10 and metal layer 50.

Specifically, first adhesive layer 20 is provided between EL structure layer 10 and intermediate layer 30, and second adhesive layer 40 is provided between intermediate layer 30 and metal layer 50.

That is, display panel 1 includes a laminated structure in which EL structure layer 10, first adhesive layer 20, intermediate layer 30, second adhesive layer 40, metal layer 50, and foamed resin layer 60 are overlapped in this order. The configuration of each layer will be described below.

EL structure layer 10 has an upper surface light emitting structure (top emission structure) and includes a plurality of EL elements arranged two-dimensionally. EL structure layer 10 has light emitting surface 10a for emitting light and back surface 10b on the opposite side of light emitting surface 10a. EL structure layer 10 is flexible and bendable.

EL structure layer 10 includes organic light emitting diode (OLED) panel 15, optical adhesive sheet (OCA: Optical Clear Adaptive) 14, thin polarizing plate 13, optical adhesive sheet 12, and cover film 11. EL structure layer 10 is a structure layer in which OLED panel 15, optical adhesive sheet 14, thin polarizing plate 13, optical adhesive sheet 12, and cover film 11 are overlapped in this order. It should be noted that OLED panel 15 includes sheet thin film transistor (TFT) 15c, OLED 15b including an organic EL element, and thin film encapsulation (TFE) 15a.

First adhesive layer 20 is a layer for joining intermediate layer 30 to EL structure layer 10. First adhesive layer 20 is provided on back surface 10b of EL structure layer 10 and is in direct contact with each of EL structure layer 10 and intermediate layer 30.

First adhesive layer 20 comprises an adhesive having an elastic modulus of 90 kPa or more. If the elastic modulus of the adhesive is small, the impact resistance will be lowered, so that the elastic modulus of the adhesive needs to be 90 kPa or more. This elastic modulus is a value of the time when a dynamic viscoelasticity test is carried out using an adhesive layer having storage elastic modulus G' and a thickness of 1000 μm as a sample under the conditions of a sample temperature of 25° C. and a frequency of 1 Hz with a shear rheometer. It should be noted that first adhesive layer 20 may comprise an adhesive having an elastic modulus of 90 kPa or more and 700 kPa or less. The adhesive included in first adhesive layer 20 is, for example, an acrylic-based adhesive. If the thickness of first adhesive layer 20 is too thick, the impact resistance will be lowered, so that it is desirable that the thickness of first adhesive layer 20 is 25 μm or less. In addition, the thickness of first adhesive layer 20 may be 5 μm or less as long as the function as an adhesive can be realized.

Intermediate layer 30 is a layer that is provided to support EL structure layer 10. Intermediate layer 30 is laminated on EL structure layer 10 via first adhesive layer 20. Intermediate layer 30 is flexible and bendable.

Intermediate layer 30 is a transparent sheet such as a polyethylene terephthalate (PET) resin sheet and the like. The Young's modulus (tensile modulus) of the material of intermediate layer 30 is smaller than that of metal layer 50 and larger than that of foamed resin layer 60, which are described later. The thickness of intermediate layer 30 is preferably 25 μm or more and 125 μm or less. Intermediate layer 30 is not limited to the PET resin sheet, and may be a polyimide resin sheet or a stainless steel sheet.

Second adhesive layer 40 is a layer for joining metal layer 50 to intermediate layer 30. Second adhesive layer 40 is in direct contact with each of intermediate layer 30 and metal layer 50.

The adhesive included in second adhesive layer 40 may be the same as the adhesive included in first adhesive layer 20. Second adhesive layer 40 comprises an adhesive having an elastic modulus of 90 kPa or more. It should be noted that when the impact resistance is ensured by first adhesive layer 20, second adhesive layer 40 may have a smaller elastic modulus than first adhesive layer 20 and may have an elastic modulus of 30 kPa or more. The thickness of second adhesive layer 40 is preferably 5 μm or more and 25 μm or less.

Metal layer 50 is a layer that is provided to reinforce EL structure layer 10. Metal layer 50 is laminated on intermediate layer 30 via second adhesive layer 40. Metal layer 50 is flexible and bendable.

Metal layer 50 is, for example, a stainless steel sheet or an aluminum sheet. The material of metal layer 50 is preferably stainless steel with rust resistance, but may be aluminum with high thermal conductivity and light weight. In addition, the material of metal layer 50 may be iron, copper, nickel, tin, brass, or an alloy containing at least two of these.

If the Young's modulus of the material of metal layer 50 is small, the impact resistance will be lowered, so that it is desirable that the Young's modulus of the material of metal layer 50 is 40 GPa or more. In order to further improve the impact resistance, it is desirable that the material of metal layer 50 is determined from the range of Young's modulus of 68 GPa or more and 250 GPa or less. This Young's modulus is defined by the Japanese Industrial Standards "JIS Z 2280: High-temperature Young's modulus test method for metal materials".

If the thickness of metal layer 50 is too thin, the impact resistance will be lowered, and if it is too thick, the flexibility will be lowered, so that it is desirable that the thickness of metal layer 50 is, for example, 10 μm or more and 200 μm or less. In order to further improve the impact resistance, it is desirable that the thickness of metal layer 50 is determined from the range of 29 μm or more and 200 μm or less.

Foamed resin layer 60 is a layer that is provided to absorb the impact applied to EL structure layer 10. Foamed resin layer 60 is flexible and bendable. Foamed resin layer 60 is, for example, silicone foam, urethane foam, or acrylic foam. Silicone foam is suitable for display panels used at low temperatures because its hardness does not change relatively even at low temperatures. When the silicone foam is applied, since both sides have a self-adhesive function, no adhesive layer is required between the silicone foam and metal layer 50. In addition, no adhesive is also required when the display panel is set in the housing.

The 25% compression load deflection (CLD) of the material of foamed resin layer 60 is not particularly specified, but it is desirable that it is 20 kPa or more and 150 kPa or less. The 25% CLD is the force required to crush the thickness of an object from 100% to 75%. This 25% CLD is measured by the method specified in the Japanese Industrial Standards "JIS K 6254".

If the thickness of foamed resin layer 60 is too thin, the shock absorption will be lowered, and if it is too thick, the flexibility will be lowered, so that it is desirable that the thickness of foamed resin layer 60 is, for example, 50 μm or more and 1500 μm or less. In order to further improve the impact resistance, it is desirable that the thickness of foamed resin layer 60 is thicker than the thickness of metal layer 50 and is determined from the range of 100 μm or more and 1000 μm or less.

In this way, it is possible to improve the impact resistance of display panel 1 by appropriately determining the configurations of first adhesive layer 20, intermediate layer 30, second adhesive layer 40, metal layer 50, and foamed resin layer 60 which are added to EL structure layer 10.

3. Test Results

Next, the impact resistance test results of display panel 1 will be described.

Figure 4:
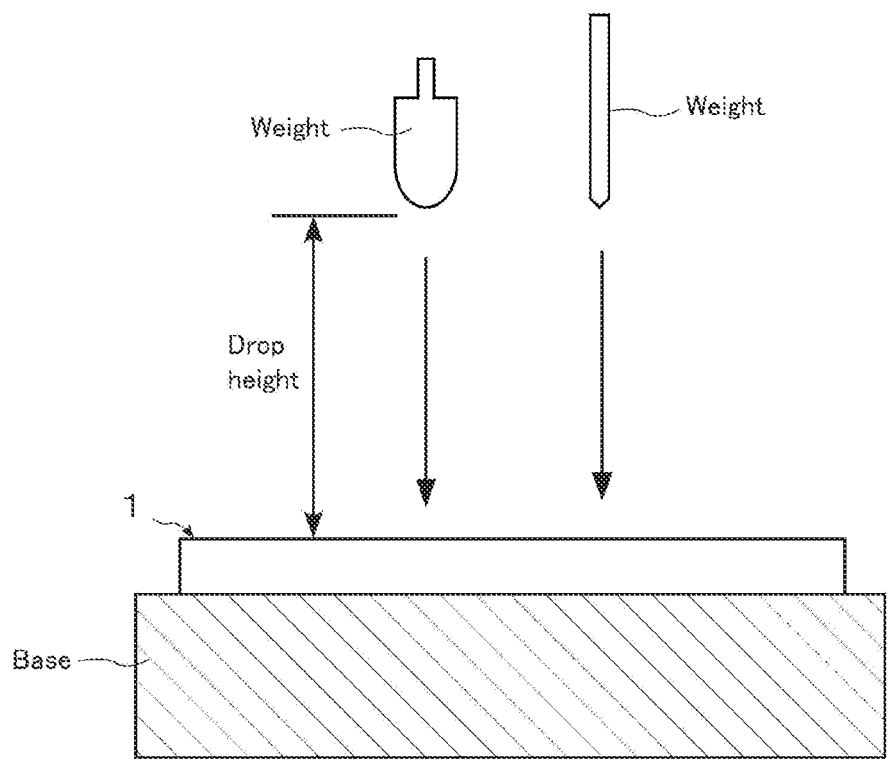
FIG. 4 is a schematic view showing a device for testing the impact resistance of the display panel.

FIG. 4 is a schematic view showing a device for testing the impact resistance of display panel 1.

In this test, display panel 1 is placed on a highly rigid base, and a weight is dropped from a predetermined drop height toward display panel 1 in 1 cm increments while display panel 1 is made to emit light. Then, at the spot where the weight hits display panel 1, the height obtained by subtracting 1 cm from the drop height of the weight at the time when the light is no longer emitted is recorded. The higher the drop height of the weight, the better the impact resistance of display panel 1. As the types of tests, two tests including a test using a weight with a weight of 30 g and a hemispherical tip with an R (radius)=9 mm (hereinafter referred to as a darts test), and a test using a weight (for example, a pen) with a weight of 4.5 g and a hemispherical tip with an R=0.35 mm (hereinafter referred to as a pen drop test) were performed. In these impact resistance tests, a case where the drop height of the weight was 10 cm or more was passed, and a case where the drop height of the weight was less than 10 cm was failed.

FIG. 5A and FIG. 5B are diagrams showing test results regarding metal layer 50 and foamed resin layer 60 of the display panel. FIG. 5A shows the result of the darts test, and FIG. 5B shows the result of the pen drop test.

As shown in FIG. 3, the display panels of FIG. 5A and FIG. 5B include EL structure layer 10, first adhesive layer 20, intermediate layer 30, second adhesive layer 40, metal layer 50, and foamed resin layer 60. EL structure layer 10 includes cover film 11 having a thickness of 90 μm, optical adhesive sheet 12 having a thickness of 50 μm, thin polarizing plate 13 having a thickness of 84 μm, optical adhesive sheet 14 having a thickness of 15 μm, and OLED panel 15. The elastic modulus of the adhesive of first adhesive layer 20 is 700 kPa, and the thickness of the adhesive layer is 5 μm. Intermediate layer 30 is a PET resin sheet having a thickness of 75 μm. The elastic modulus of the adhesive of second adhesive layer 40 is 700 kPa, and the thickness of the adhesive layer is 5 μm.

In addition, FIG. 5A and FIG. 5B show an example in which the display panel is not provided with metal layer 50 and an example in which the display panel is provided with metal layer 50 and the thickness of metal layer 50 is changed. A stainless sheet is used as metal layer 50. In addition, FIG. 5A and FIG. 5B show an example in which the display panel is not provided with foamed resin layer 60 and an example in which the display panel is provided with foamed resin layer 60 and the thickness of foamed resin layer 60 is changed. In addition, FIG. 5A and FIG. 5B show an example in which the material of foamed resin layer 60 is urethane foam or silicone foam. It should be noted that the 25% CLD of the urethane foam used for foamed resin layer 60 is 20 kPa, and the 25% CLD of the silicone foam is 131 kPa.

As shown in FIG. 5A and FIG. 5B, when the display panel is not provided with metal layer 50, both the darts test and the pen drop test have failed. In addition, when the display panel is not provided with foamed resin layer 60, the pen drop test has failed. That is, it is not sufficient for display panel 1 to include only one of metal layer 50 and foamed resin layer 60, and it is necessary to include both metal layer 50 and foamed resin layer 60.

In addition, as shown in the pen drop test of FIG. 5B, the stainless steel sheet, which is an example of metal layer 50, has failed when the thickness of the stainless sheet is 5 μm or less, and has passed when the thickness is 10 μm or more. It should be noted that in this example, the upper limit value of the thickness of metal layer 50 is set to 200 μm in consideration of the bendability of metal layer 50.

Next, the test results regarding first adhesive layer 20, intermediate layer 30, and second adhesive layer 40 of display panel 1 will be described with reference to FIG. 6A to FIG. 6G.

FIG. 6A to FIG. 6G are diagrams showing test results regarding first adhesive layer 20, intermediate layer 30, and second adhesive layer 40 of display panel 1.

As shown in FIG. 3, samples s1 to s11 of the display panel shown in FIG. 6A to FIG. 6G include EL structure layer 10, first adhesive layer 20, intermediate layer 30, second adhesive layer 40, metal layer 50, and foamed resin layer 60. Metal layer 50 is a stainless steel sheet having a thickness of 200 μm. Foamed resin layer 60 is a silicone foam having a thickness of 800 μm. EL structure layer 10 includes cover film 11 having a thickness of 90 μm, optical adhesive sheet 12 having a thickness of 50 μm, thin polarizing plate 13 having a thickness of 84 μm, optical adhesive sheet 14 having a thickness of 15 μm, and OLED panel 15. It should be noted that a silicone foam having the 25% CLD of 131 kPa was used for foamed resin layer 60 here.

In each of samples s1 to s11, the configurations of first adhesive layer 20, intermediate layer 30, and second adhesive layer 40 are different, and the configurations of other layers are the same. Hereinafter, an example in which the configurations of first adhesive layer 20, intermediate layer 30, and second adhesive layer 40 are changed will be described.

Figure 6A:
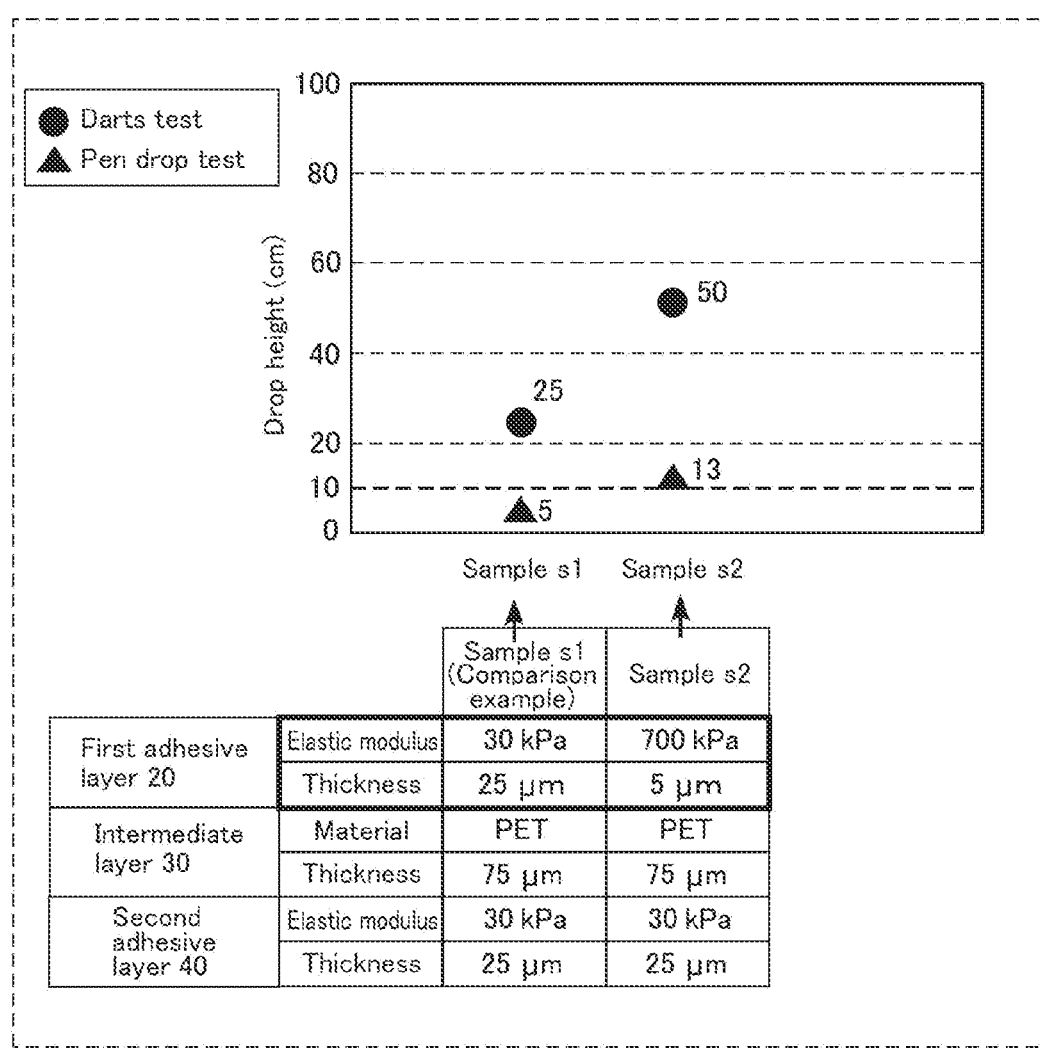
FIG. 6A is a diagram showing test results regarding a first adhesive layer, an intermediate layer, and a second adhesive layer of the display panel.

FIG. 6A shows sample s1 corresponding to the comparative example and sample s2 corresponding to the embodiment. The configuration of first adhesive layer 20 is different between sample s1 and sample s2.

The first adhesive layer of sample s1 (comparative example) comprises an adhesive having an elastic modulus of 30 kPa, and the thickness of the adhesive layer is 25 μm. The drop height of sample s1 in the darts test is 25 cm, but the drop height in the pen drop test is 5 cm, so that the impact resistance test result is unacceptable.

First adhesive layer 20 of sample s2 comprises an adhesive having an elastic modulus of 700 kPa, and the elastic modulus of the adhesive is higher than that of sample s1. In addition, the thickness of first adhesive layer 20 of sample s2 is 5 μm, which is thinner than the thickness of the adhesive layer of sample s1. The drop height of sample s2 in the darts test is 50 cm, the drop height in the pen drop test is 13 cm, and the impact resistance test result is acceptable. As shown in FIG. 6A, the impact resistance of display panel 1 is improved by increasing the elastic modulus of the adhesive included in first adhesive layer 20 and reducing the thickness.

Figure 6B:
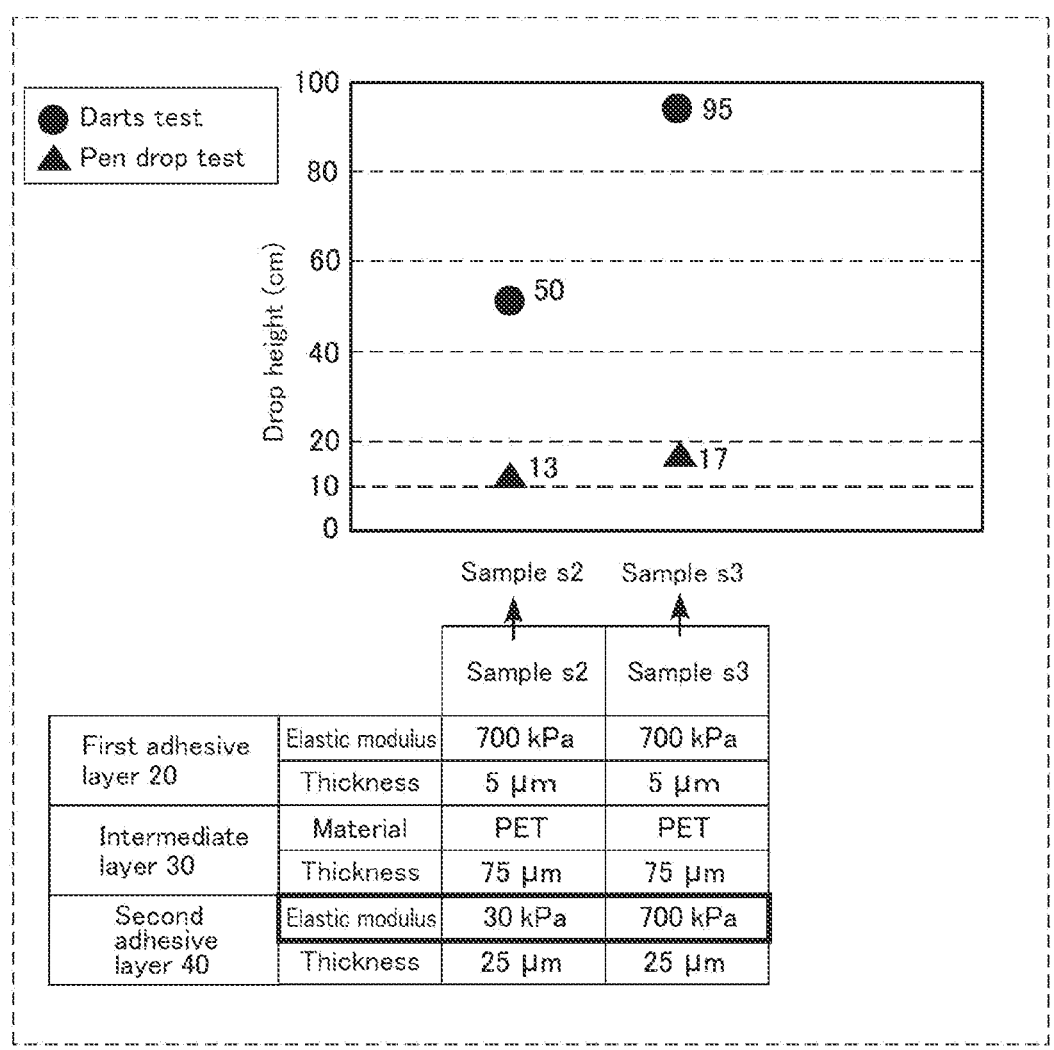
FIG. 6B is a diagram showing test results regarding a first adhesive layer, an intermediate layer, and a second adhesive layer of the display panel.

FIG. 6B shows sample s2 and sample s3 corresponding to the embodiment. The configurations of second adhesive layer 40 are different between sample s2 and sample s3.

Second adhesive layer 40 of sample s2 comprises an adhesive having an elastic modulus of 30 kPa. The drop height of sample s2 in the darts test is 50 cm, and the drop height in the pen drop test is 13 cm. Second adhesive layer 40 of sample s3 comprises an adhesive having an elastic modulus of 700 kPa. The drop height of sample s3 in the darts test is 95 cm, and the drop height in the pen drop test is 17 cm. As shown in FIG. 6B, by increasing the elastic modulus of the adhesive of second adhesive layer 40, the impact resistance of display panel 1 is improved.

Figure 6C:
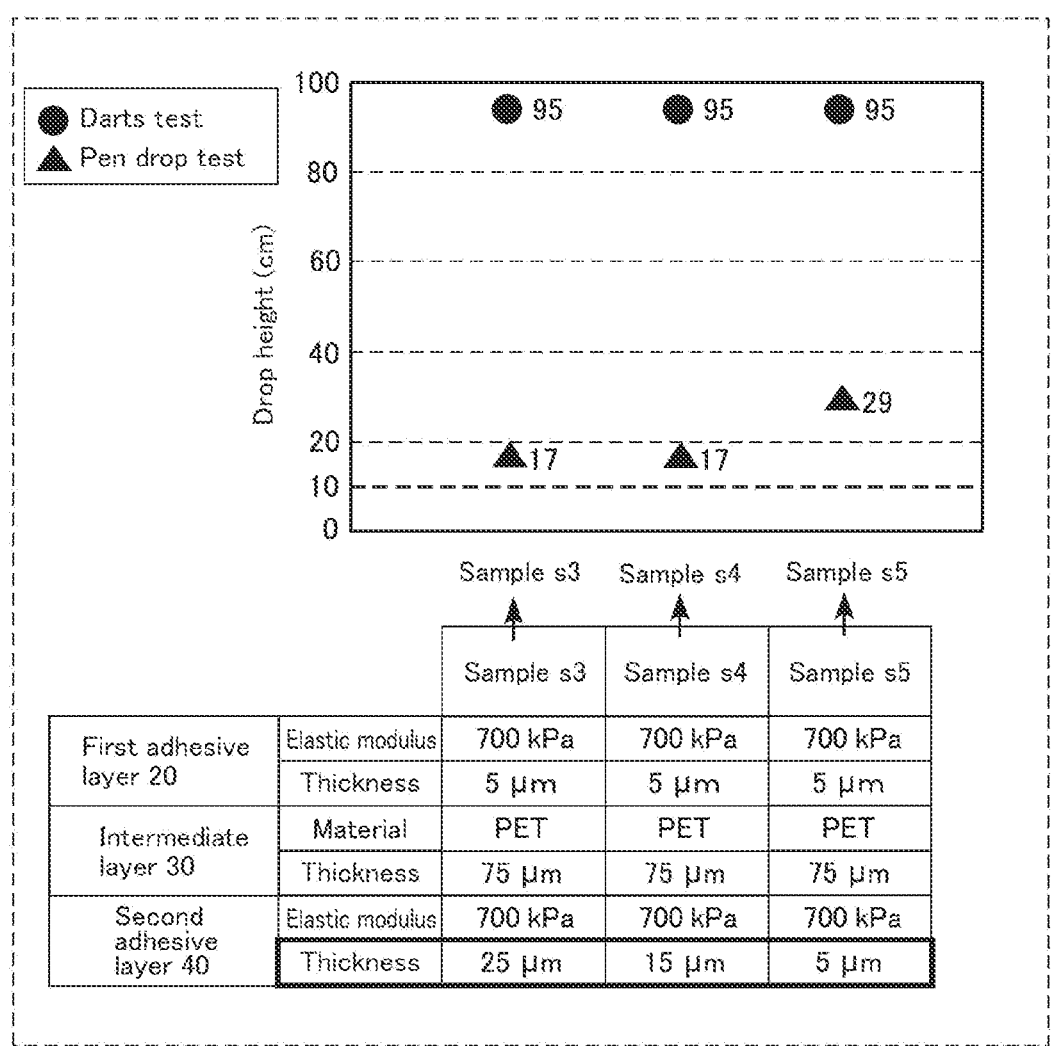
FIG. 6C is a diagram showing test results regarding a first adhesive layer, an intermediate layer, and a second adhesive layer of the display panel.

FIG. 6C shows sample s3, sample s4, and sample s5 corresponding to the embodiment. The configurations of second adhesive layer 40 are different among samples s3 to s5.

The thickness of second adhesive layer 40 of sample s3 is 25 μm, the thickness of second adhesive layer 40 of sample s4 is 15 μm, and the thickness of second adhesive layer 40 of sample s5 is 5 μm. The drop height of sample s3 and sample s4 in the pen drop test is 17 cm, but the drop height of sample s5 in the pen drop test is 29 cm. As shown in FIG. 6C, the impact resistance of display panel 1 is improved by reducing the thickness of the adhesive layer of second adhesive layer 40.

It should be noted that the drop height could not be set to exceed 95 cm in this test, so even if the darts test passed the drop height of 95 cm, the test result of the darts test was set to the drop height of 95 cm. Hereinafter, the description of the darts test will be omitted, and only the description of the pen drop test will be given.

Figure 6D:
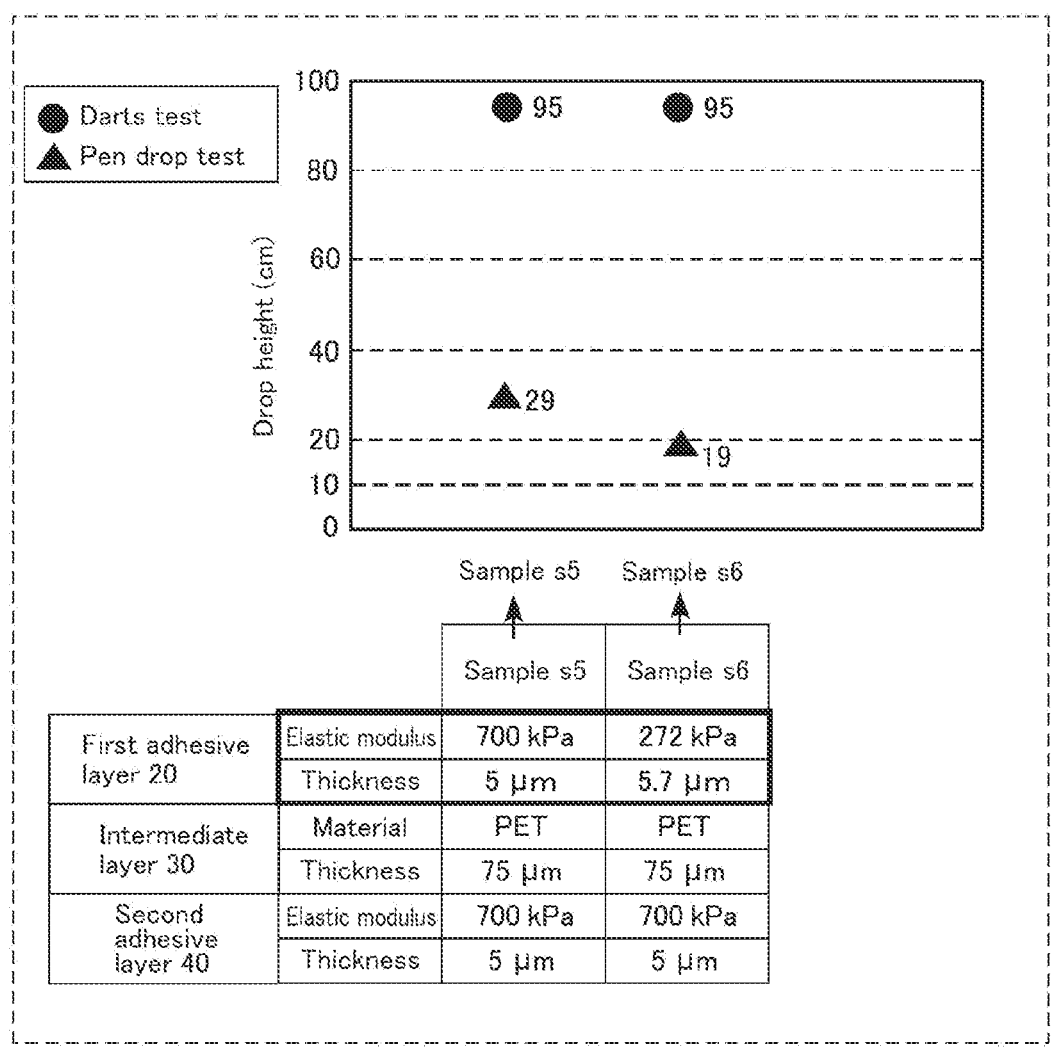
FIG. 6D is a diagram showing test results regarding a first adhesive layer, an intermediate layer, and a second adhesive layer of the display panel.

FIG. 6D shows sample s5 and sample s6 that correspond to the embodiment. The configurations of first adhesive layer 20 are different between sample s5 and sample s6.

First adhesive layer 20 of sample s5 comprises an adhesive having an elastic modulus of 700 kPa, the thickness of first adhesive layer 20 is 5 μm, and the drop height in the pen drop test is 29 cm. First adhesive layer 20 of sample s6 comprises an adhesive having an elastic modulus of 272 kPa, the thickness of first adhesive layer 20 is 5.7 μm, and the drop height in the pen drop test is 19 cm. As shown in FIG. 6D, the impact resistance of display panel 1 is improved by increasing the elastic modulus of the adhesive of first adhesive layer 20 and reducing the thickness of the adhesive layer.

Figure 6E:
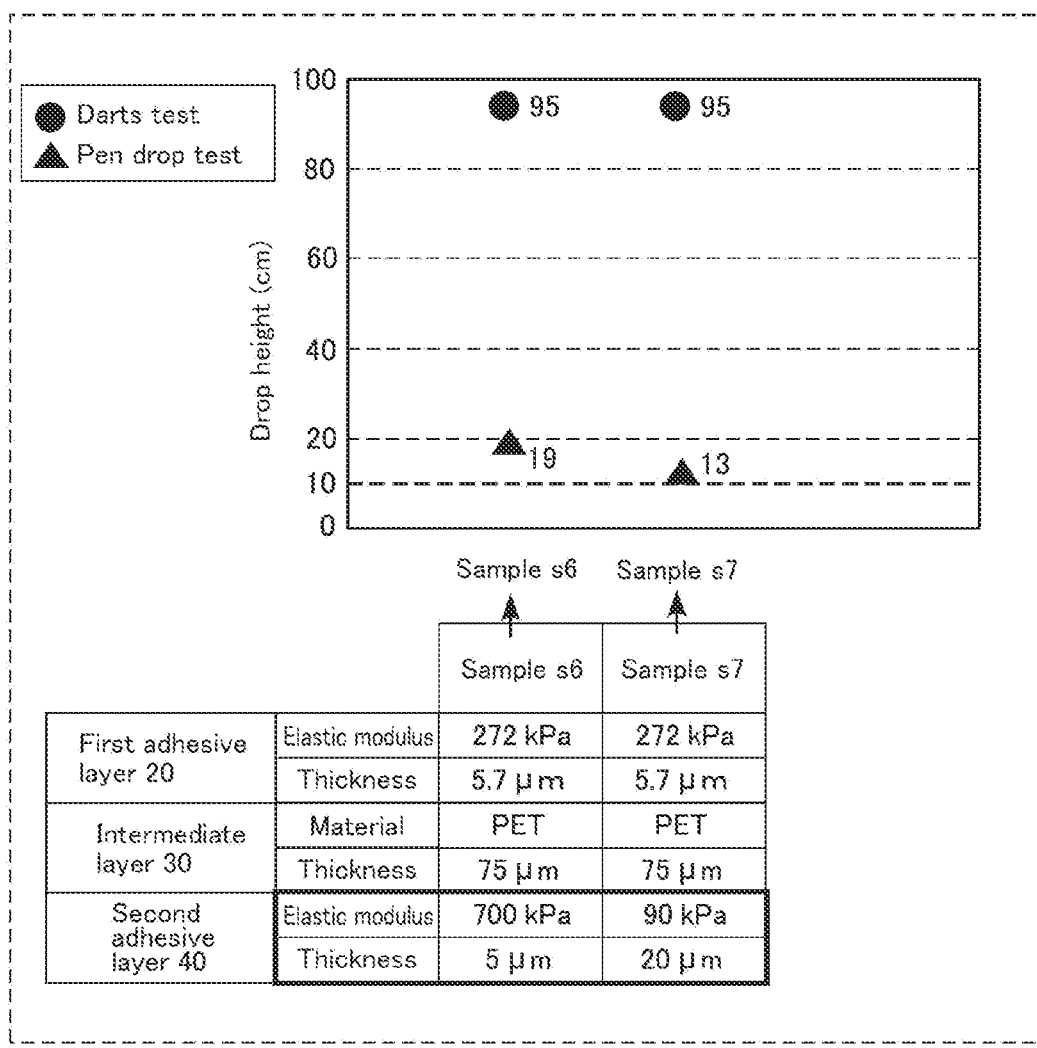
FIG. 6E is a diagram showing test results regarding a first adhesive layer, an intermediate layer, and a second adhesive layer of the display panel.

FIG. 6E shows sample s6 and sample s7 that correspond to the embodiment. The configurations of second adhesive layer 40 are different between sample s6 and sample s7.

Second adhesive layer 40 of sample s6 comprises an adhesive having an elastic modulus of 700 kPa, the thickness of second adhesive layer 40 is 5 μm, and the drop height in the pen drop test is 19 cm. Second adhesive layer 40 of sample s7 comprises an adhesive having an elastic modulus of 90 kPa, the thickness of second adhesive layer 40 is 20 μm, and the drop height in the pen drop test is 13 cm. As shown in FIG. 6E, the impact resistance of display panel 1 is improved by increasing the elastic modulus of the adhesive of second adhesive layer 40 and reducing the thickness of the adhesive layer.

Figure 6F:
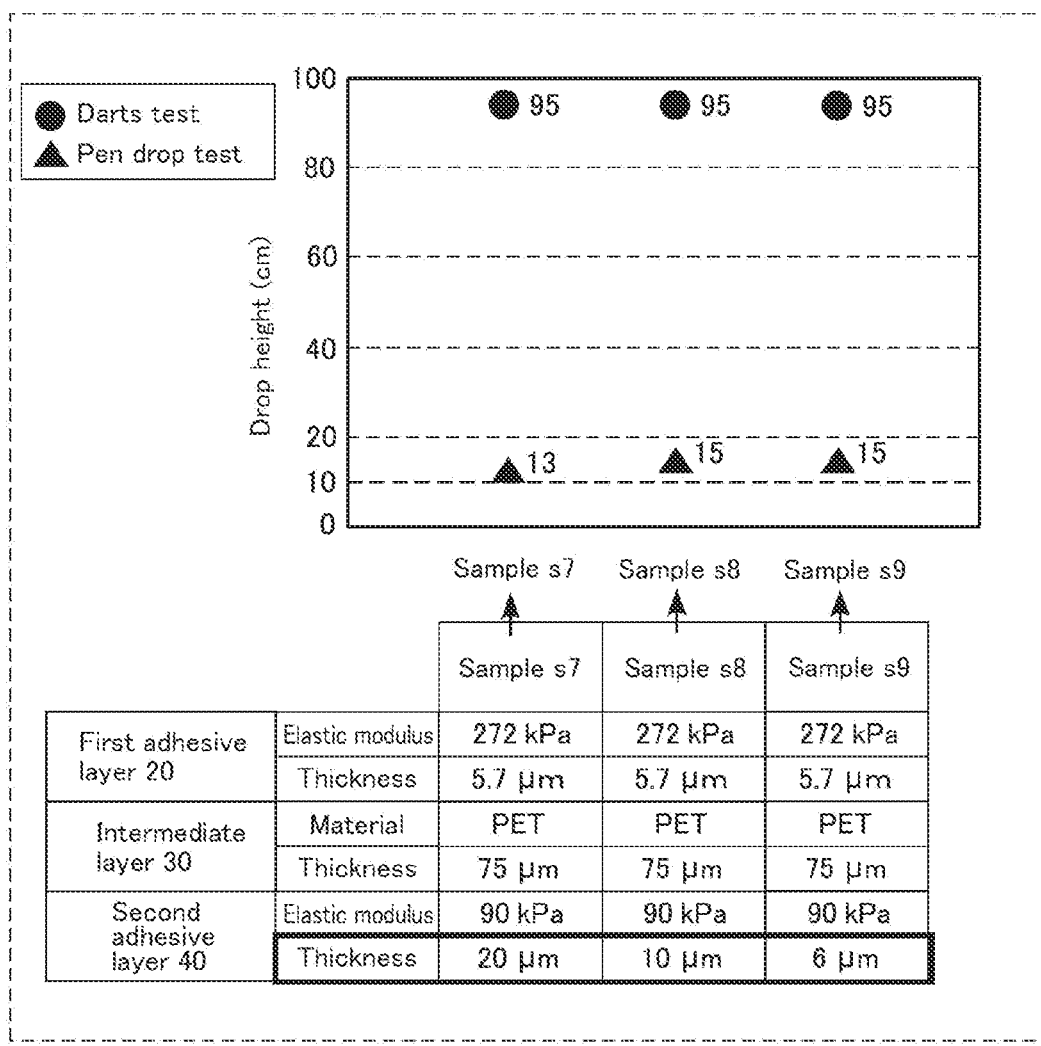
FIG. 6F is a diagram showing test results regarding a first adhesive layer, an intermediate layer, and a second adhesive layer of the display panel.

FIG. 6F shows samples s7, sample s8, and sample s9 that correspond to the embodiment. The configurations of second adhesive layer 40 are different among samples s7 to s9.

The thickness of second adhesive layer 40 of sample s7 is 20 μm, the thickness of second adhesive layer 40 of sample s8 is 10 μm, and the thickness of second adhesive layer 40 of sample s9 is 6 μm. The drop height of sample s7 in the pen drop test is 13 cm, but the drop height of sample s8 and sample s9 in the pen drop test is 15 cm. As shown in FIG. 6F, the impact resistance of display panel 1 is improved by reducing the thickness of the adhesive layer of second adhesive layer 40.

Figure 6G:
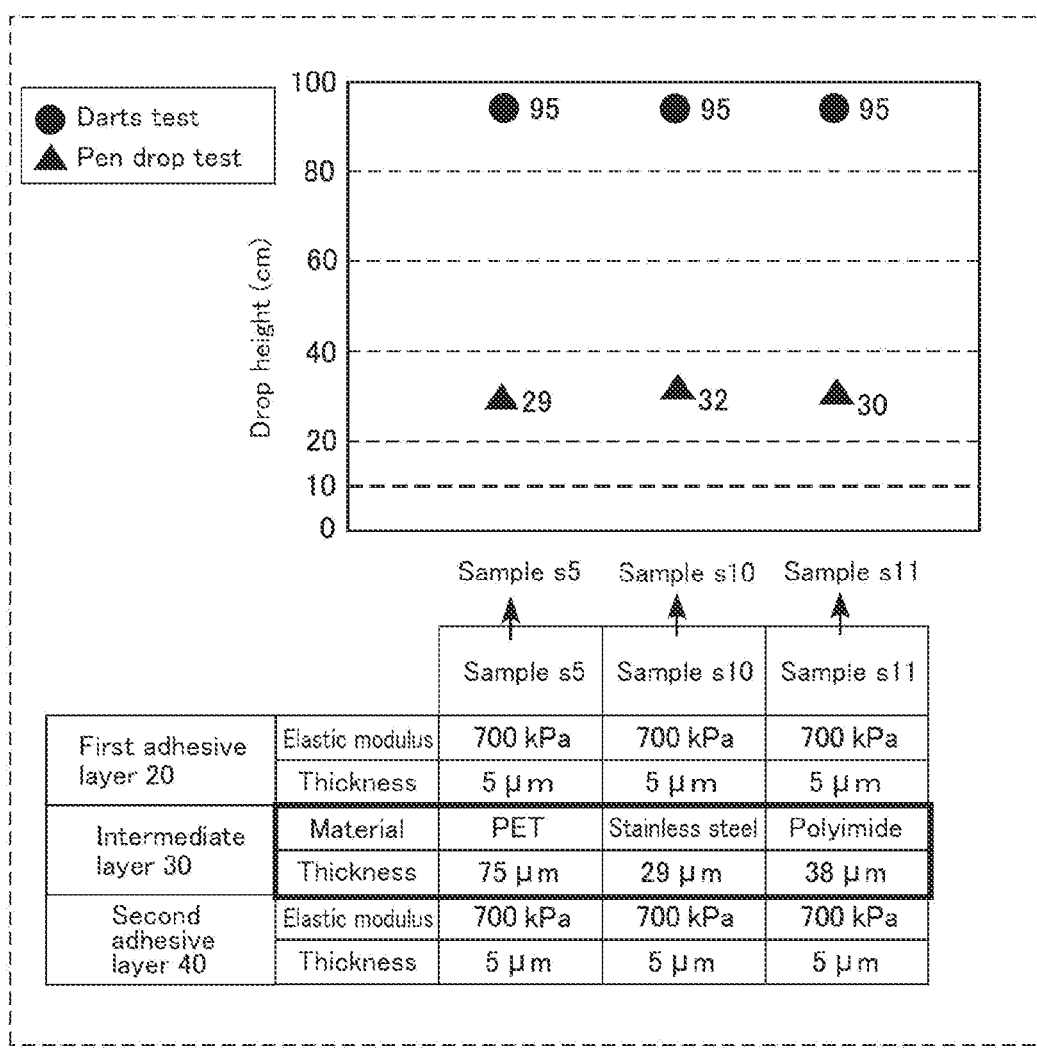
FIG. 6G is a diagram showing test results regarding a first adhesive layer, an intermediate layer, and a second adhesive layer of the display panel.

FIG. 6G shows samples s5, sample s10, and sample s11 that correspond to the embodiment. The configurations of intermediate layer 30 are different among sample s5, sample s10, and sample s11.

Intermediate layer 30 of sample s5 comprises a PET resin sheet having a thickness of 75 µm, and the drop height in the pen drop test is 29 cm. Intermediate layer 30 of sample s10 comprises a stainless steel sheet having a thickness of 29 µm, and the drop height in the pen drop test is 32 cm. Intermediate layer 30 of sample s11 comprises a polyimide resin sheet having a thickness of 38 µm, and the drop height in the pen drop test is 30 cm. As shown in FIG. 6G, the impact resistance is improved by the stainless steel sheet as compared with the PET resin sheet or the polyimide resin sheet. In addition, the impact resistance of display panel 1 is improved by the stainless steel sheet having a thinner thickness than the PET resin sheet or the polyimide resin sheet.

It should be noted that it is desirable that the 25% CLD of foamed resin layer 60 of display panel 1 is 20 kPa or more and 150 kPa or less. The reason is that for example, when a local impact is applied to EL structure layer 10, if the value of the 25% CLD is too small, the foam material is crushed and the impact reaches the inside of EL structure layer 10 to damage EL structure layer 10, while if the value of the 25% CLD is too large, the impact cannot be absorbed as a whole and EL structure layer 10 is destroyed.

4. Variation of the Embodiment

Next, display panel 1A according to a variation of the embodiment will be described. In this variation, an example in which display panel 1A does not include intermediate layer 30 and second adhesive layer 40 will be described.

Figure 7:
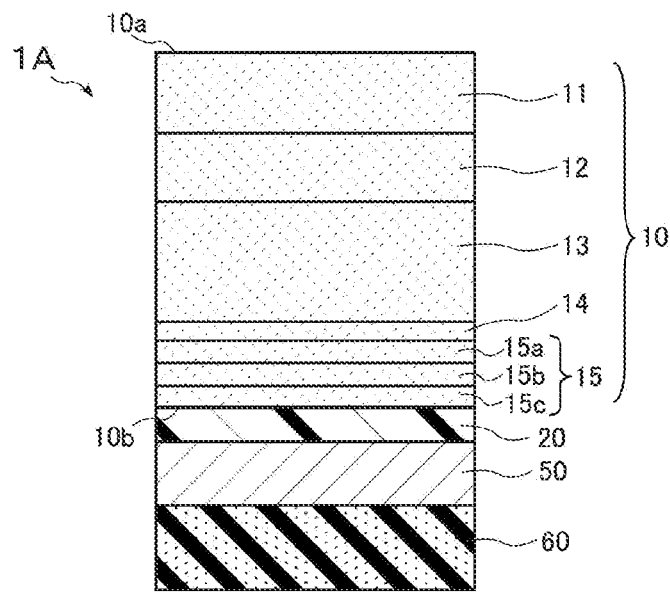
FIG. 7 is a cross-sectional view of a display panel according to a variation of the embodiment.

FIG. 7 is a cross-sectional view of display panel 1A according to the variation of the embodiment. FIG. 7 is a cross-sectional view of the yz plane or the xy plane in FIG. 1.

Display panel 1A includes EL structure layer 10, first adhesive layer 20, metal layer 50, and foamed resin layer 60.

Foamed resin layer 60 is provided on the opposite side of light emitting surface 10a of EL structure layer 10. Metal layer 50 is provided between EL structure layer 10 and foamed resin layer 60. First adhesive layer 20 is provided between EL structure layer 10 and metal layer 50.

That is, display panel 1A includes a laminated structure in which EL structure layer 10, first adhesive layer 20, metal layer 50, and foamed resin layer 60 are overlapped in this order.

EL structure layer 10 is the same as that of the embodiment, and the description thereof will be omitted.

First adhesive layer 20 is a layer for joining metal layer 50 to EL structure layer 10. First adhesive layer 20 is provided on back surface 10b of EL structure layer 10 and is in direct contact with each of EL structure layer 10 and metal layer 50.

First adhesive layer 20 comprises an adhesive having an elastic modulus of 90 kPa or more. The adhesive included in first adhesive layer 20 is, for example, an acrylic-based adhesive. The thickness of first adhesive layer 20 is preferably 5 µm or more and 25 µm or less.

Metal layer 50 is a layer that is provided to reinforce EL structure layer 10. Metal layer 50 is laminated on EL structure layer 10 via first adhesive layer 20. Metal layer 50 is flexible and bendable.

Metal layer 50 is, for example, a stainless steel sheet or an aluminum sheet. The material of metal layer 50 is preferably stainless steel with rust resistance, but may be aluminum with high thermal conductivity and light weight. In addition, the material of metal layer 50 may be iron, copper, nickel, tin, brass, or an alloy containing at least two of these.

It is desirable that the Young's modulus of the material of metal layer 50 is 40 GPa or more. In order to further improve the impact resistance, it is desirable that the material of metal layer 50 is determined from the range of Young's modulus of 68 GPa or more and 250 GPa or less. The thickness of metal layer 50 is preferably, for example, 10 µm or more and 200 µm or less. In order to further improve the impact resistance, it is desirable that the thickness of metal layer 50 is determined from the range of 29 µm or more and 200 µm or less.

Foamed resin layer 60 is a layer that is provided to absorb the impact applied to EL structure layer 10. Foamed resin layer 60 is flexible and bendable. As for foamed resin layer 60, it is desirable that the 25% CLD of the material is 20 kPa or more and 150 kPa or less, similar to that described in the embodiment. The thickness of foamed resin layer 60 is preferably, for example, 50 µm or more and 1500 µm or less. In order to further improve the impact resistance, it is desirable that the thickness of foamed resin layer 60 is thicker than the thickness of metal layer 50 and is determined from the range of 700 µm or more and 1000 µm or less.

Next, the test results regarding first adhesive layer 20 of display panel 1A will be described with reference to FIG. 8.

Figure 8:
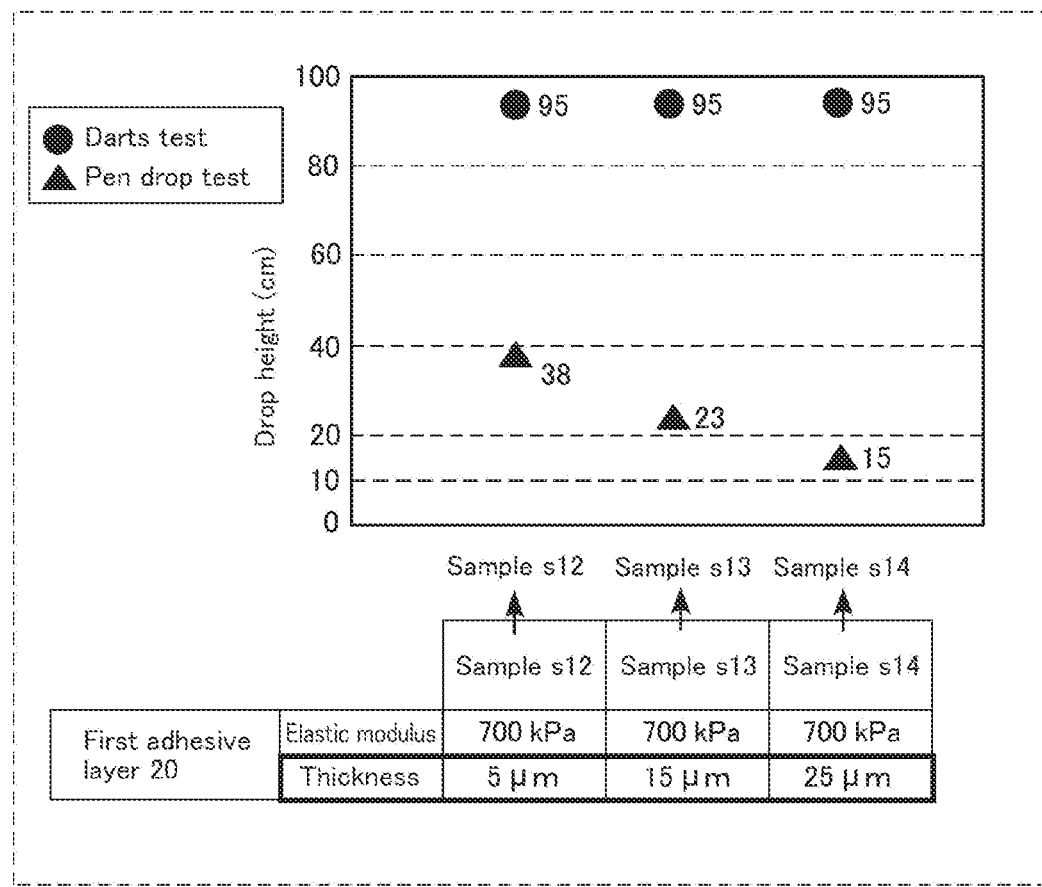
FIG. 8 is a diagram showing test results regarding a first adhesive layer of the display panel according to the variation.

FIG. 8 is a diagram showing test results regarding first adhesive layer 20 of display panel 1A according to the variation of the embodiment.

Samples s12 to s14 of display panel 1A shown in FIG. 8 include EL structure layer 10, first adhesive layer 20, metal layer 50, and foamed resin layer 60. Metal layer 50 is a stainless steel sheet having a thickness of 200 µm. Foamed resin layer 60 is a silicone foam having a thickness of 800 µm. EL structure layer 10 includes cover film 11 having a thickness of 90 µm, optical adhesive sheet 12 having a thickness of 50 µm, thin polarizing plate 13 having a thickness of 84 µm, optical adhesive sheet 14 having a thickness of 15 µm, and OLED panel 15. It should be noted that a silicone foam having the 25% CLD of 131 kPa was used for foamed resin layer 60 here.

FIG. 8 shows sample s12, sample s13, and sample s14 that correspond to the variation of the embodiment. The configurations of first adhesive layer 20 are different among samples s12 to s14.

The thickness of first adhesive layer 20 of sample s12 is 5 µm, and the drop height in the pen drop test is 38 cm. The thickness of first adhesive layer 20 of sample s13 is 15 µm, and the drop height in the pen drop test is 23 cm. The thickness of first adhesive layer 20 of sample s14 is 25 µm, and the drop height in the pen drop test is 15 cm. As shown in FIG. 8, the thinner the thickness of the adhesive layer of first adhesive layer 20, the better the impact resistance of display panel 1A.

As in this variation, the impact resistance of display panel 1A can be improved by appropriately determining the configurations of first adhesive layer 20, metal layer 50, and foamed resin layer 60 which are added to EL structure layer 10.

5. Effect, Etc

Display panels 1 and 1A according to the present embodiment are display panels that is flexible, including: EL structure layer 10 including a plurality of EL elements arranged two-dimensionally; foamed resin layer 60 on a side of the EL structure layer that is opposite to light emitting surface 10a of EL structure layer 10; metal layer 50 provided between EL structure layer 10 and foamed resin layer 60;

and first adhesive layer 20 provided between EL structure layer 10 and metal layer 50 and comprises an adhesive having an elastic modulus of 90 kPa or more.

In this way, the impact resistance of display panels 1 and 1A can be improved by display panels 1 and 1A including both metal layer 50 and foamed resin layer 60. In addition, the impact resistance of display panels 1 and 1A can be improved by first adhesive layer 20 comprising an adhesive having an elastic modulus of 90 kPa or more.

In addition, the thickness of first adhesive layer 20 may be 25 μm or less.

By setting the thickness of first adhesive layer 20 to 25 μm or less in this way, the reinforcing effect of metal layer 50 that reinforces EL structure layer 10 can be suppressed from being reduced more than necessary by first adhesive layer 20. With this, the impact resistance of display panels 1 and 1A can be improved.

In addition, first adhesive layer 20 may be in contact with EL structure layer 10.

According to this, it is possible to improve the reinforcing effect of metal layer 50 that reinforces EL structure layer 10 via first adhesive layer 20. With this, the impact resistance of display panels 1 and 1A can be improved.

In addition, foamed resin layer 60 may be a silicone foam or a urethane foam.

By making foamed resin layer 60 of a silicone foam or urethane foam in this way, the impact applied to EL structure layer 10 can be effectively absorbed. With this, the impact resistance of display panels 1 and 1A can be improved.

In addition, the thickness of metal layer 50 may be 10 μm or more and 200 μm or less.

According to this, it is possible to improve the reinforcing effect at the time when EL structure layer 10 is reinforced by using metal layer 50. With this, the impact resistance of display panels 1 and 1A can be improved.

In addition, metal layer 50 may be a stainless steel sheet.

According to this, it is possible to improve the reinforcing effect at the time when EL structure layer 10 is reinforced by using the stainless steel sheet. With this, the impact resistance of display panels 1 and 1A can be improved.

In addition, display panel 1 may further include intermediate layer 30 provided between first adhesive layer 20 and metal layer 50, and second adhesive layer 40 provided between metal layer 50 and intermediate layer 30.

According to this, EL structure layer 10 can be supported by intermediate layer 30. With this, for example, the rigidity of EL structure layer 10 or a member included in EL structure layer 10 can be increased, and EL structure layer 10 or a member included in the EL structure can be reliably conveyed.

In addition, intermediate layer 30 may be a PET resin sheet.

According to this, EL structure layer 10 can be supported by the PET resin sheet. With this, for example, the rigidity of EL structure layer 10 or a member included in EL structure layer 10 can be increased, and EL structure layer 10 or a member included in the EL structure can be reliably conveyed.

Display device 90 according to the present embodiment includes display panel 1 or 1A described above and driver 98 that drives display panel 1 or 1A.

According to this, it is possible to provide display device 90 including display panel 1 or 1A with impact resistance.

OTHER EMBODIMENTS

Although display panels 1 and 1A and display device 90 according to the present disclosure have been described above based on an exemplary embodiment, the present disclosure is not limited to the above embodiment. Variations obtained by applying various modifications to the above-described embodiment that a person skilled in the art can conceive without departing from the spirit of the present disclosure, or various equipment that incorporate a display panel according to the present disclosure is also included in the present disclosure.

In the embodiment, an example is shown in which the adhesive of the adhesive layer is an acrylic-based adhesive, but the present disclosure is not limited thereto. For example, the adhesive may be an epoxy-based adhesive, a siloxane-based adhesive, a urethane-based adhesive, a silane coupling agent, a natural rubber-based adhesive, or a synthetic rubber-based adhesive.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The display panel according to the present disclosure can be used as a flexible display panel in a display device such as a digital television, digital signage, a smartphone, a tablet terminal, or a wearable terminal.

The invention claimed is:

1. A display panel that is flexible, the display panel comprising:
   an electroluminescence (EL) structure layer including a plurality of EL elements arranged two-dimensionally;
   a foamed resin layer on a side of the EL structure layer that is opposite to a light emitting surface of the EL structure layer;
   a metal layer provided between the EL structure layer and the foamed resin layer;
   an intermediate layer provided between the EL structure layer and the metal layer;
   a first adhesive layer provided between and directly in contact with the EL structure layer and the intermediate layer, the first adhesive layer comprising an adhesive having a first elastic modulus of 90 kPa or more; and
   a second adhesive layer provided between and directly in contact with the intermediate layer and the metal layer, the second adhesive layer having a second elastic modulus greater than 30 kPa and smaller than the first elastic modulus of the first adhesive layer,
   wherein a force required to crush a thickness of the foamed resin layer from 100% to 75% is at least 20 kPa and less than 150 kPa,
   whereby the display panel includes the following, in order from the foamed resin layer to the EL structure: the metal layer; the second adhesive layer; the intermediate layer; and the first adhesive layer.

2. The display panel according to claim 1,
   wherein the first adhesive layer has a thickness of 25 μm or less.

3. The display panel according to claim 1,
   wherein the foamed resin layer is silicone foam or urethane foam.

4. The display panel according to claim 1,
   wherein the metal layer has a thickness of 10 μm or more and 200 μm or less.

5. The display panel according to claim 1,
wherein the metal layer is a stainless steel sheet.
6. The display panel according to claim 1,
wherein the intermediate layer is a polyethylene terephthalate (PET) resin sheet.
7. A display device, comprising:
the display panel according to claim 1; and
a driver that drives the display panel.
8. The display panel according to claim 1,
wherein the metal layer directly contacts the foamed resin layer, while being provided between the EL structure layer and the foamed resin layer.
9. The display panel according to claim 1,
wherein a material of the metal layer is stainless steel with rust resistance.
10. The display panel according to claim 1,
wherein a Young's modulus of a material of the metal layer is at least 68 GPa and at most 250 GPa.
11. The display panel according to claim 1,
wherein a thickness the metal layer is at least 29 μm and at most 200 μm.

* * * * *